(12) United States Patent
Li

(10) Patent No.: US 12,404,603 B2
(45) Date of Patent: Sep. 2, 2025

(54) GAS INLET ASSEMBLY OF PROCESS CHAMBER, GAS INLET DEVICE, AND SEMICONDUCTOR PROCESSING APPARATUS

(71) Applicant: BEIJING NAURA MICROELECTRONICS EQUIPMENT CO., LTD., Beijing (CN)

(72) Inventor: Shikai Li, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/262,261

(22) PCT Filed: Dec. 28, 2021

(86) PCT No.: PCT/CN2021/141995
§ 371 (c)(1),
(2) Date: Jul. 20, 2023

(87) PCT Pub. No.: WO2022/156495
PCT Pub. Date: Jul. 28, 2022

(65) Prior Publication Data
US 2024/0117522 A1  Apr. 11, 2024

(30) Foreign Application Priority Data
Jan. 22, 2021  (CN) .................. 202110093628.0

(51) Int. Cl.
*C23C 16/40* (2006.01)
*C23C 16/455* (2006.01)
*C30B 25/14* (2006.01)

(52) U.S. Cl.
CPC ........ *C30B 25/14* (2013.01); *C23C 16/45561* (2013.01); *C23C 16/45563* (2013.01)

(58) Field of Classification Search
CPC ... C30B 25/14; C30B 29/36; C23C 16/45561; C23C 16/45563; C23C 16/4558
(Continued)

(56) References Cited

U.S. PATENT DOCUMENTS

| 2012/0111271 A1* | 5/2012 | Begarney | ........ C23C 16/45565 118/724 |
| 2012/0240853 A1* | 9/2012 | Carlson | ............ C23C 16/45578 118/715 |

(Continued)

FOREIGN PATENT DOCUMENTS

| CN | 105331952 A | 2/2016 |
| CN | 105529283 A | 4/2016 |

(Continued)

OTHER PUBLICATIONS

The World Intellectual Property Organization (WIPO) International Search Report for PCT/CN2021/141995 Mar. 30, 2022 8 Pages (including translation).

(Continued)

*Primary Examiner* — Rudy Zervigon
(74) *Attorney, Agent, or Firm* — ANOVA LAW GROUP, PLLC

(57) ABSTRACT

A gas inlet assembly of a process chamber of a semiconductor process apparatus, a gas inlet device, and a semiconductor processing apparatus are provided. The gas inlet assembly is configured to transport the process gas to the gas inlet pipeline that communicates with the process chamber. The gas inlet assembly includes a plurality of mixing chambers arranged sequentially along the gas inlet direction. Any two neighboring mixing chambers communicate with (Continued)

each other. The gas inlet assembly includes a gas inlet connector. The gas inlet connector communicates with the mixing chamber at the most upstream in the gas inlet direction. The mixing chamber at the most downstream in the gas inlet direction communicates with the gas inlet pipeline.

10 Claims, 14 Drawing Sheets

(58) Field of Classification Search
USPC .................. 118/715; 156/345.33, 345.34
See application file for complete search history.

(56) References Cited

U.S. PATENT DOCUMENTS

| | | | |
|---|---|---|---|
| 2013/0052806 A1* | 2/2013 | Bertram, Jr. ............ | C30B 25/14 137/15.01 |
| 2014/0291286 A1* | 10/2014 | Okayama .......... | C23C 16/45519 239/548 |
| 2014/0326185 A1* | 11/2014 | Lau ................... | C23C 16/45563 118/728 |
| 2015/0292088 A1* | 10/2015 | Canizares ......... | C23C 16/45504 118/715 |
| 2016/0217979 A1* | 7/2016 | Kim .................... | H01J 37/3244 |
| 2017/0167024 A1* | 6/2017 | Wiltse ............... | C23C 16/45574 |

FOREIGN PATENT DOCUMENTS

| | | |
|---|---|---|
| CN | 207282513 U | 4/2018 |
| CN | 108728820 A | 11/2018 |
| CN | 111020693 A | 4/2020 |
| CN | 210826439 U | 6/2020 |
| CN | 111403256 A | 7/2020 |
| CN | 112941626 A | 6/2021 |
| JP | 2000269147 A | 9/2000 |
| WO | 8912703 A1 | 12/1989 |
| WO | 2015020474 A1 | 2/2015 |
| WO | 2015178687 A1 | 11/2015 |

OTHER PUBLICATIONS

The European Patent Office (EPO) The Extended European Search Report for Application No. 21920866.7 May 23, 2025 242 Pages.

* cited by examiner

GAS INLET ASSEMBLY OF PROCESS CHAMBER, GAS INLET DEVICE, AND SEMICONDUCTOR PROCESSING APPARATUS

CROSS-REFERENCE TO RELATED APPLICATIONS

This application is a national phase entry under 35 U.S.C. § 371 of International Application No. PCT/CN2021/141995, filed on Dec. 28, 2021, which claims priority to Chinese Application No. 202110093628.0 filed on Jan. 22, 2021, the entire contents of both of which are incorporated herein by reference.

TECHNICAL FIELD

The present disclosure generally relates to the semiconductor manufacturing field and, more particularly, to a semiconductor processing apparatus, a gas inlet assembly, and a gas inlet device of a process chamber in the semiconductor processing apparatus.

BACKGROUND

Epitaxial growth refers to a growth of a single crystal layer on a substrate with the same crystal orientation as the substrate. Compared to a growth environment of silicon epitaxy, a process environment of silicon carbide epitaxy has a higher temperature, which ranges from 1500° C. to 1800° C. The silicon carbide epitaxy has a longer growth cycle. Currently, chemical vapor deposition (CVD) is mainly used to grow a silicon carbide epitaxial layer.

In the process of epitaxial growth, control of a gas flow field is an important factor affecting process uniformity. However, existing gas inlet devices often have the following problems in practical applications.

First, a process gas including a plurality of gas components output by the existing gas inlet device enters a process chamber without being sufficiently mixed. Thus, the gas components of the process gas are distributed unevenly in the process chamber, which causes different reaction rates at different positions of the substrate to affect the process uniformity.

Second, as shown in FIG. 1, the existing gas inlet device includes three diversion chambers configured to divert the process gas. The number of gas inlet holes corresponding to the middle diversion chamber is relatively large, the gas inlet holes are arranged in a center position of the diversion chamber, and the process gas entering from the gas inlet holes does not have enough time to fully diffuse towards two edges before entering the middle diversion chamber. Thus, a gas flow speed output by gas inlet holes in the middle is higher than a gas flow speed output by gas inlet holes at the two edges. This speed difference causes a gas flow field in the diversion chamber to generate a turbulent region including a dead zone and a vortex. As shown in A region of FIG. 1, since the process gas stops in the dead zone, the process gas overflows after the process gas in the dead zone is saturated. The process gas flows to the process chamber to react with the substrate to cause differences in fabrication processes of the substrate to affect the process stability.

SUMMARY

The present disclosure aims to address at least one technical problem in the existing technology and provides a gas inlet assembly of a process chamber in a semiconductor process apparatus, a gas inlet device, and a semiconductor processing apparatus, which can sufficiently mix a plurality of gas components in the process gas to cause the process gas to sufficiently diffuse and improve the distribution uniformity of the components of the process gas to further improve the process stability.

To realize the purpose of the present disclosure, a gas inlet assembly of a process chamber of a semiconductor process apparatus is provided. The gas inlet assembly is configured to transport the process gas to the gas inlet pipeline communicating with the process chamber.

A plurality of mixing chambers are arranged sequentially along a gas inlet direction, and any two neighboring mixing chambers communicate with each other. The gas inlet assembly includes a gas inlet connector communicating with a most upstream mixing chamber in the gas inlet direction. The most downstream mixing chamber in the gas inlet direction communicates with the gas inlet pipeline. The gas outlet direction of the gas inlet assembly is same as the gas inlet direction.

In some embodiments, the gas inlet assembly includes a gas inlet member, one or more mixing members, and a jet plate connected sequentially along the gas inlet direction.

Grooves with openings facing the gas inlet direction are formed at the gas inlet member and the one or more mixing members. The gas inlet connector is arranged at the gas inlet member. The groove of the gas inlet member cooperates with a most upstream mixing member in the gas inlet direction to form the mixing chamber. In any two neighboring mixing members, a groove of an upstream mixing member cooperates with a downstream mixing member to form a mixing chamber.

The jet plate is arranged at an opening of the groove of the most downstream mixing member in the gas inlet direction and cooperates with the groove of the most downstream mixing member in the gas inlet direction to form a mixing chamber.

In some embodiments, a gas inlet hole is arranged at a bottom of the groove of the gas inlet member. The gas inlet connector communicates with the gas inlet hole. A gas uniform hole is arranged at the bottom of the groove of the one or more mixing members. Any two neighboring mixing chambers communicate with each other through the gas uniform hole. A jet hole is arranged at the jet plate. The most downstream mixing chamber in the gas inlet direction communicates with the gas inlet pipeline through the jet hole.

In some embodiments, at least one isolation member is arranged in the groove and configured to divide the groove into a plurality of sub-grooves in a direction perpendicular to the gas inlet direction. A plurality of gas inlet holes are provided and are divided into a plurality of gas inlet hole groups. A number of the gas inlet hole groups is same as a number of the sub-grooves, and the gas inlet hole groups are in a one-to-one correspondence with the sub-grooves. A plurality of gas uniform holes are provided and divided into a plurality of gas uniform hole groups. The number of the gas uniform hole groups is same as the number of the sub-grooves, and the gas uniform hole groups is in a one-to-one correspondence with the sub-grooves. A plurality of jet holes are provided and divided into a plurality of jet hole groups. The number of the jet hole groups is same as the number of the sub-grooves, and the jet hole groups is in a one-to-one correspondence with the sub-grooves. The gas outlet direction of the jet hole is the gas outlet direction.

In some embodiments, each gas uniform hole group includes a plurality of gas uniform holes. The plurality of gas uniform holes in the same gas uniform hole group are arranged in an array. Diameters of the plurality of gas uniform holes gradually increase from a center of the sub-groove to edges on two sides.

In some embodiments, from upstream to downstream along the gas inlet direction, a number of rows of gas uniform holes in different gas uniform hole groups gradually increases, and a number of gas uniform holes in a same row in different gas uniform hole groups gradually increases.

In some embodiments, in the gas inlet direction, gas uniform holes in any two neighboring gas uniform hole groups are staggered.

In some embodiments, each jet hole group includes a plurality of jet holes. The plurality of jet holes are arranged in an array. Diameters of the plurality of jet holes are same and smaller than diameters of the gas uniform holes. The number of rows of the plurality of jet holes of the jet hole group is greater than a number of rows of the plurality of gas uniform holes of the corresponding gas uniform hole group. The number of jet holes of any row of the jet hole group is greater than the number of the gas uniform holes in a same row of the corresponding gas uniform hole group.

As another technical solution, embodiments of the present disclosure provide a gas inlet device, including the gas inlet assembly, the gas inlet pipeline, and the transition assembly of embodiments of the present disclosure. The gas inlet assembly and the transition assembly are arranged at two ends of the gas inlet pipeline, respectively, and the gas inlet pipeline communicates with the process chamber through the transition assembly.

In some embodiments, the gas inlet pipeline includes a gradually expanding pipe segment and a straight pipe segment arranged sequentially along the gas inlet direction, and a cross-sectional size of the gradually expanding pipe segment gradually increases along the gas inlet direction.

In some embodiments, a division plate is arranged in the gas inlet pipeline and configured to divide the gas inlet pipeline into a plurality of gas flow channels along a direction perpendicular to the gas inlet direction. The division plate includes a uniform thickness portion and a gradually thinning portion arranged sequentially along the gas inlet direction. A thickness of the gradually thinning portion gradually decreases along the gas inlet direction.

In some embodiments, the transition assembly includes a plurality of transition members inserted sequentially along the gas inlet direction. A most upstream transition member in the gas inlet direction is inserted into the gas inlet pipeline. A most downstream transition member in the gas inlet direction communicates with the process chamber.

In some embodiments, the gas inlet pipeline is made of quartz, and the transition member is made of graphite.

As another technical solution, embodiments of the present disclosure further provide a semiconductor processing apparatus, including a process chamber and the gas inlet device of the process chamber of embodiments of the present disclosure.

The present disclosure includes the following beneficial effects.

Embodiments of the present disclosure provide the gas inlet assembly of the process chamber of the semiconductor process apparatus. The plurality of mixing chambers are arranged in the gas inlet assembly sequentially along the gas inlet direction. Any two neighboring mixing chambers communicate with each other. The gas inlet assembly includes a gas inlet connector. The gas inlet connector communicates with the mixing chamber at the most upstream in the gas inlet direction. The mixing chamber at the most downstream in the gas inlet direction communicates with the gas inlet pipeline. By arranging the plurality of mixing chambers along the gas inlet direction, the process gas can be mixed in layers. Thus, the plurality of gas components in the process gas can be sufficiently mixed to cause the process gas to sufficiently diffuse and improve the distribution uniformity of the components of the process gas. Thus, the process stability can be improved. Meanwhile, in the process of the gas inlet assembly transporting the process gas to the gas inlet pipeline communicating with the process chamber, since the process gas sufficiently diffuses in the mixing chamber, the differences of the gas flow speeds between different areas of the gas inlet pipeline can be reduced. Thus, the process gas in the dead zone can be prevented from entering the process chamber to react with the substrate to cause the differences in the fabrication processes of different substrates. Thus, the process stability can be improved. In addition, by causing the gas outlet direction of the gas inlet assembly to be same as the gas inlet direction, the process gas can enter the gas inlet pipeline in a shortest path. Thus, the gas inlet efficiency can be improved. Meanwhile, since the gas inlet assembly is configured to transport the process gas into the gas inlet pipeline, in this case, by causing the gas outlet direction of the gas inlet assembly to be the same as the gas inlet direction, the differences in the gas flow speeds between different areas of the gas inlet pipeline can be reduced. Thus, the uniformity of the gas flow speed can be improved.

Embodiments of the present disclosure provide a gas inlet device. By adopting the gas inlet assembly of embodiments of the present disclosure, the distribution uniformity of the components of the process gas can be improved, and the differences in the gas flow speeds between different areas of the gas inlet pipeline can be reduced. Thus, the process stability can be improved.

Embodiments of the present disclosure provide a semiconductor processing apparatus. By adopting the gas inlet device of embodiments of the present disclosure, the process gas can be sufficiently mixed and homogenized. Thus, the distribution uniformity of the components of the process gas can be improved, and the differences in the gas flow speeds between different areas of the process chamber can be improved. Thus, the process stability can be improved.

DETAILED DESCRIPTION OF THE EMBODIMENTS

To help those skilled in the art better understand the technical solutions of the present disclosure, a gas inlet assembly of a process chamber in a semiconductor process apparatus, a gas inlet device, and a semiconductor processing apparatus of embodiments of the present disclosure are described in detail in connection with the accompanying drawings.

First Embodiment

Figure 1:
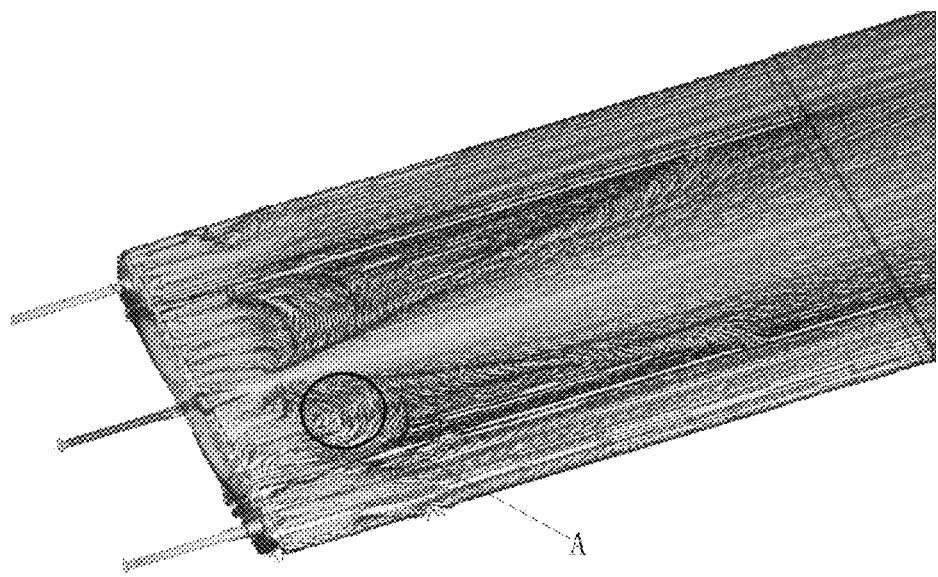
FIG. 1 illustrates a schematic diagram showing an existing layout of a gas flow field of a gas inlet device.
Figure 2:
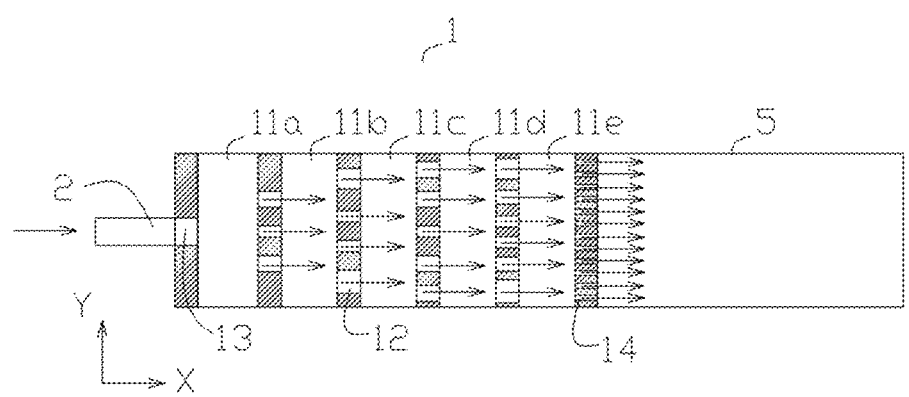
FIG. 2 illustrates a schematic cross-sectional diagram showing a gas inlet assembly of a process chamber in a semiconductor processing apparatus on plane X-Y according to an embodiment of the present disclosure.

Please refer to FIG. 2, the present embodiment provides a gas inlet assembly 1 of a process chamber of a semiconductor process apparatus. The gas inlet assembly 1 is configured to transport a process gas to a gas inlet pipeline 5 communicated with the process chamber (not shown in the figure). The semiconductor process apparatus can be, for example, an epitaxial growth apparatus. The process temperature of the process chamber is usually relatively high (e.g., above 1600° C.). In this case, the gas inlet assembly 1 cannot be directly connected to the process chamber. The process gas can only be transported into the process chamber through the gas inlet pipeline 5. The gas inlet pipeline can have a thermal insulation function. Thus, the gas inlet assembly 1 (usually made of a metal material) can be away from the process chamber. The gas inlet pipeline can be, for example, a quartz pipeline.

In some embodiments, a plurality of mixing chambers are arranged sequentially along a gas inlet direction (i.e., direction X in FIG. 2) in the gas inlet assembly. For example, FIG. 2 shows five mixing chambers (11a-11e). Any two neighboring mixing chambers can communicate with each other. For example, a plurality of uniform gas holes 12 are arranged between any two neighboring mixing chambers. The plurality of uniform gas holes 12 communicate with the two neighboring mixing chambers. The plurality of uniform gas holes 12 are arranged along a direction perpendicular to the gas inlet direction (i.e., direction Y in FIG. 2) at intervals to uniformly transport the process gas. Moreover, the gas inlet assembly 1 includes a gas inlet connector 2. The gas inlet connector 2 communicates with an most upstream mixing chamber (i.e., mixing chamber 11a in FIG. 2) along a gas inlet direction. For example, in the gas inlet assembly 1, a gas inlet hole 13 is arranged upstream of the most upstream mixing chamber 11a and communicates with the mixing chamber 11a. The gas inlet hole 13 is connected to the gas inlet connector 2. The gas inlet connector 2 is connected to a gas inlet pipeline (not shown in the figure) of a gas source. The process gas provided by the gas source can flow into the most upstream mixing chamber 11a sequentially through the gas inlet connector 2 and the gas inlet hole 13. In some embodiments, the gas inlet hole 13 is arranged at a center position of the mixing chamber 11a, which communicates with the gas inlet hole 13, in direction Y. Thus, diffusion paths towards the two sides of the process gas flowing into the most upstream mixing chamber 11a through the gas inlet hole 13 are same. In addition, a mixing chamber (i.e., a mixing chamber 11e in FIG. 2) arranged at the lowermost in the gas inlet direction communicates with the gas inlet pipeline 5. For example, in the gas inlet assembly 1, a plurality of jet holes 14 are arranged downstream of the most downstream mixing chamber 11e and communicate with the mixing chamber 11e and the gas inlet pipeline 5. The plurality of jet holes 14 are arranged along a direction (i.e., direction Y in FIG. 2) perpendicular to the gas inlet direction at intervals to uniformly transport the process gas to the gas inlet pipeline 5.

A gas outlet direction of the gas inlet assembly 1 is a direction in which the gas flows out from the most downstream mixing chamber. The gas outlet direction is same as the gas inlet direction (i.e., direction X in FIG. 2). Thus, the process gas can flow into the gas inlet pipeline 5 in the shortest path to improve gas inlet efficiency. Meanwhile, since the gas inlet assembly 1 is configured to transport the process gas to the gas inlet pipeline 5, in this case, by causing the gas outlet direction of the gas inlet assembly to be the same as the gas inlet direction, a difference in gas flow speeds among different regions (especially different regions in direction Y) of the gas inlet pipeline 5 can be reduced, and the uniformity of the gas flow speed can be improved.

By sequentially arranging a plurality of mixing chambers along the gas inlet direction, the process gas can be mixed in layers. Thus, the plurality of gas components of the process gas can be sufficiently mixed to cause the process gas to sufficiently diffuse and improve the uniformity of the distribution of the components of the process gas to further improve the process stability. Meanwhile, in a process of transporting the process gas to the gas inlet pipeline 5 communicating with the process chamber, since the process gas sufficiently diffuses in the mixing chamber, the difference in gas flow speeds among different regions (especially different regions in direction Y) of the gas inlet pipeline 5 can be reduced, which prevents the gas flow field of the gas inlet pipeline 5 from generating a turbulent zone including a dead zone and a vortex. Thus, the process gas in the dead zone can be prevented from entering the process chamber to react with the substrate and cause differences in the fabrication processes of different substrates. Thus, the process stability can be improved.

Second Embodiment

Figure 3A:
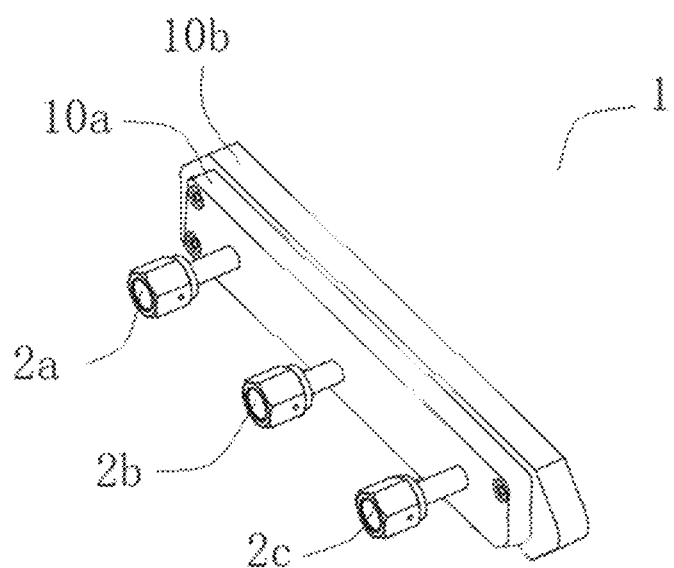
FIG. 3A illustrates a schematic perspective diagram showing a gas inlet assembly of a process chamber in a semiconductor processing apparatus according to an embodiment of the present disclosure.
Figure 3B:
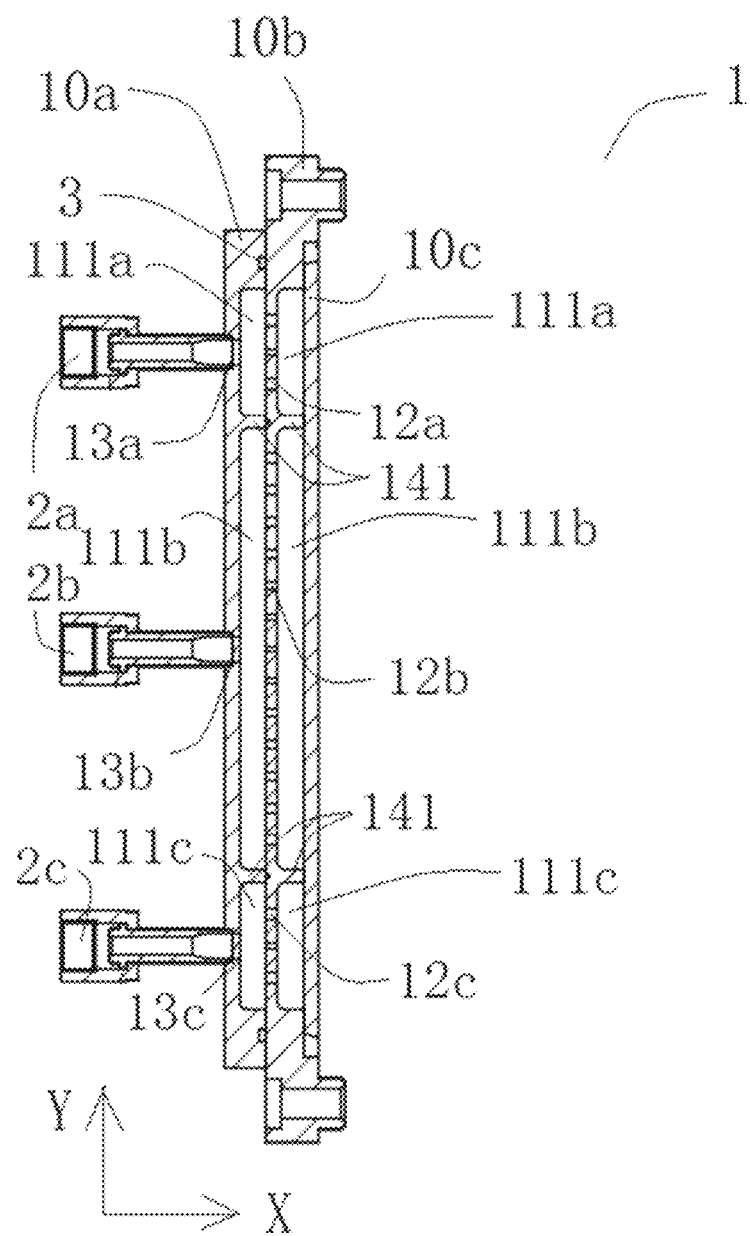
FIG. 3B illustrates a schematic cross-sectional diagram showing a gas inlet assembly of a process chamber in a semiconductor processing apparatus on plane X-Y according to an embodiment of the present disclosure.
Figure 3C:
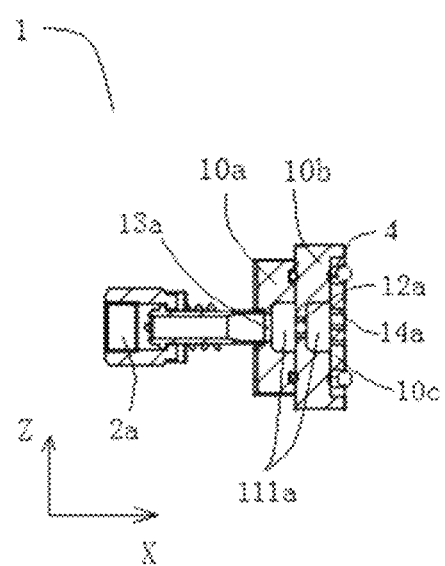
FIG. 3C illustrates a schematic cross-sectional diagram showing a gas inlet assembly of a process chamber in a semiconductor processing apparatus on plane X-Y according to an embodiment of the present disclosure.
Figure 4:
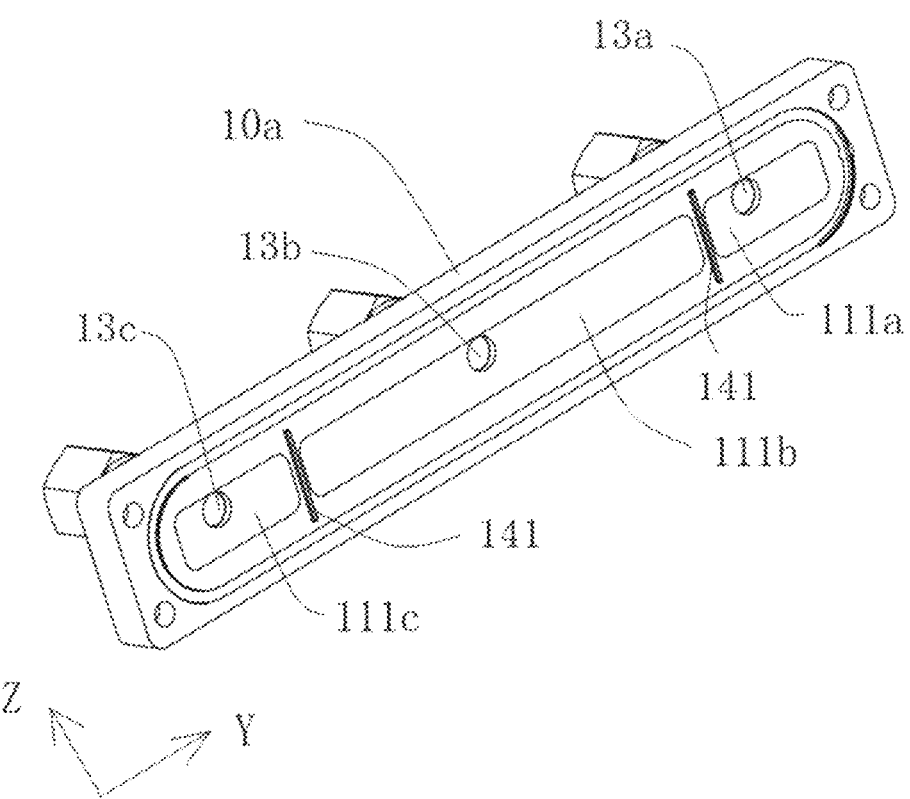
FIG. 4 illustrates a schematic structural diagram of a gas inlet part according to an embodiment of the present disclosure.
Figure 5:
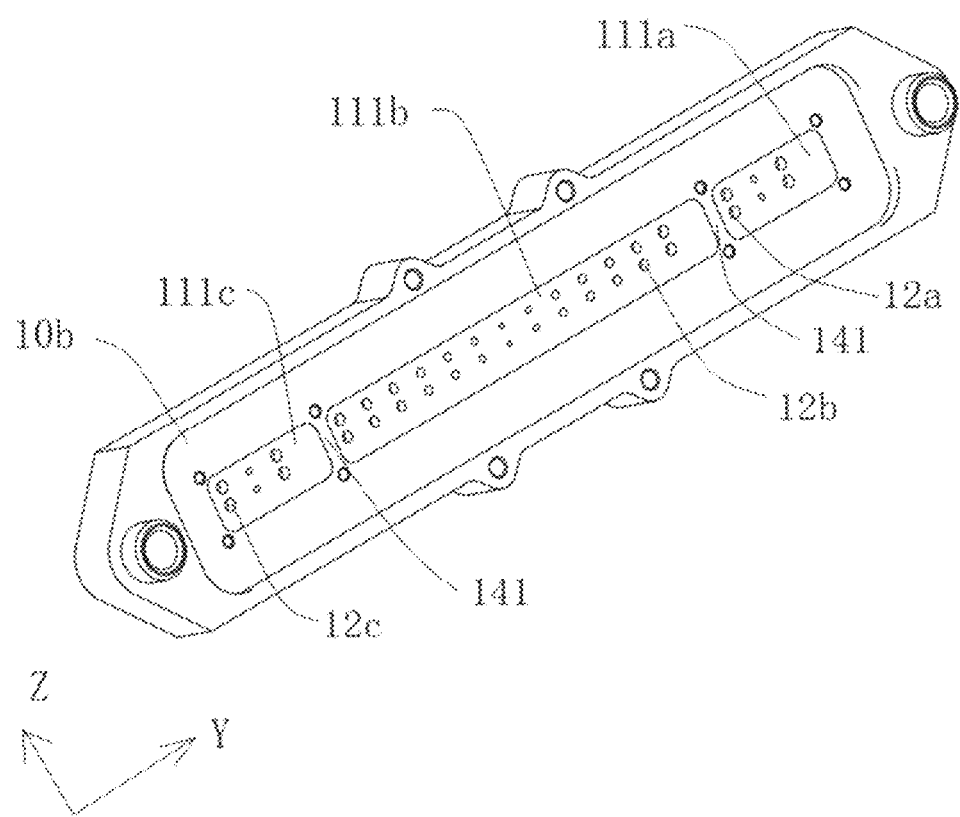
FIG. 5 illustrates a schematic structural diagram of a gas mixer according to an embodiment of the present disclosure.
Figure 5A:
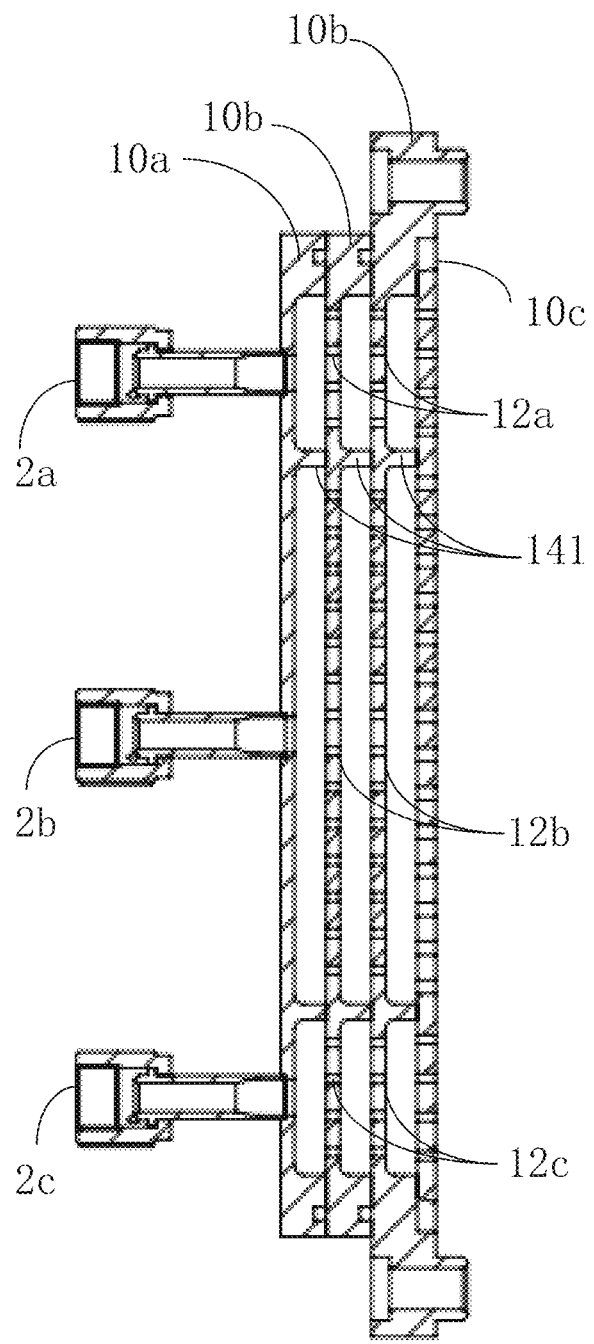
FIG. 5A illustrates a schematic cross-sectional diagram showing a gas inlet assembly of a process chamber in a semiconductor processing apparatus according to an embodiment of the present disclosure.

A gas inlet assembly according to a second embodiment of the present disclosure is improved based on the gas inlet assembly of the first embodiment. In some embodiments, as shown in FIG. 3A to FIG. 6, the gas inlet assembly 1 has a modular structure and includes a gas inlet member 10a, one or more mixing members 10b, and a jet plate 10c, which are sequentially connected along the gas inlet direction (i.e., direction X in FIG. 3B). For example, when one mixing member 10b is provided. The gas inlet member 10a and the mixing chamber 10b include grooves with openings facing the gas inlet direction (i.e., direction X in FIG. 3B). An isolation member 141 is arranged in the grooves and configured to divide the grooves into a plurality sub-grooves in a direction (i.e., direction Y in FIG. 3B) perpendicular to the gas inlet direction. For example, as shown in FIGS. 4, 5, and 5A, each of the grooves of the gas inlet member 10a and the mixing member 10b includes two isolation members 141, which are configured to divide each of the grooves of the gas inlet member 10a and the mixing member 10b into three sub-grooves (111a, 111b, and 111c). The three sub-grooves (111a, 111b, and 111c) are arranged at intervals in direction Y.

A plurality of gas inlet holes are provided. The plurality of gas inlet holes can be divided into a plurality of gas inlet hole groups. The number of the gas inlet hole groups can be the same as a number of the sub-grooves and can be arranged in a one-to-one correspondence. For example, as shown in FIG. 4, corresponding to the three sub-grooves (111a, 111b, and 111c), the plurality of gas inlet holes are divided into three gas inlet hole groups. Each gas inlet hole group can include one or a plurality of gas inlet holes. For example, each gas inlet hole group can include one gas inlet hole. Three gas inlet hole groups can include gas inlet holes 13a, 13b, and 13c, respectively, which are correspondingly arranged at the bottoms of the three sub-grooves (111a, 111b, and 111c). The gas inlet assembly 1 includes three gas inlet connectors (2a, 2b, and 2c). The three gas inlet connectors (2a, 2b, and 2c) are arranged at the gas inlet member 10a and communicate with the three sub-grooves (111a, 111b, and 111c) of the gas inlet member 10a through the three gas inlet holes (13a, 13b, and 13c). In some optical embodiments, as shown in FIG. 3B, the three gas inlet holes (13a, 13b, and 13c) can be correspondingly arranged at center positions of the three sub-grooves (111a, 111b, and 111c) in the direction Y, which facilitates the gas to evenly diffuse towards the periphery.

In some embodiments, as shown in FIGS. 4, 5, and 5A, the three sub-grooves (111a, 111b, 111c) of the gas inlet member 10a can correspondingly cooperate with the most upstream mixing member 10b to form a mixing chamber. As shown in FIG. 5A, in any two neighboring mixing members 10b, a groove of an upstream mixing member 10b can cooperate with a downstream mixing member 10b to form a mixing chamber. Taking the most upstream mixing member 10b as an example, the gas inlet member 10a and the most upstream mixing member 10b are stacked with each other in direction X, and the three sub-grooves (111a, 111b, 111c) of the gas inlet member 10a cooperate with the most upstream mixing member 10b to form three enclosed mixing chambers. That is, the inner surfaces of the three sub-grooves (111a, 111b, 111c) and a surface of the most upstream mixing member 10b opposite to the sub-grooves are enclosed to form the enclosed mixing chambers.

In some embodiments, a first sealing ring 3 can be arranged between the gas inlet member 10a and the mixing member 10b to seal the mixing chambers. Of course, when a plurality of mixing members 10b are provided (e.g., as shown in FIG. 5A), a first sealing ring 3 can be also arranged between any two neighboring mixing members 10b to seal the mixing chambers.

In some embodiments, the jet plate 10c is arranged at the opening of the groove of the most downstream mixing member in the gas inlet direction and cooperates with the groove of the most downstream mixing member to form a mixing chamber. For example, when one mixing member 10b is provided, end surfaces of grooves of the jet plate 10c and the mixing member 10b facing the gas inlet direction can be stacked with each other and can cooperate with the three sub-grooves (111a, 111b, and 111c) of the mixing member 10b to correspondingly form the three enclosed mixing chambers. That is, the inner surfaces of the three sub-grooves (111a, 111b, and 111c) and the surface of the jet plate 10c, which is opposite to the sub-grooves, can enclose to form the enclosed mixing chambers.

Figure 6:
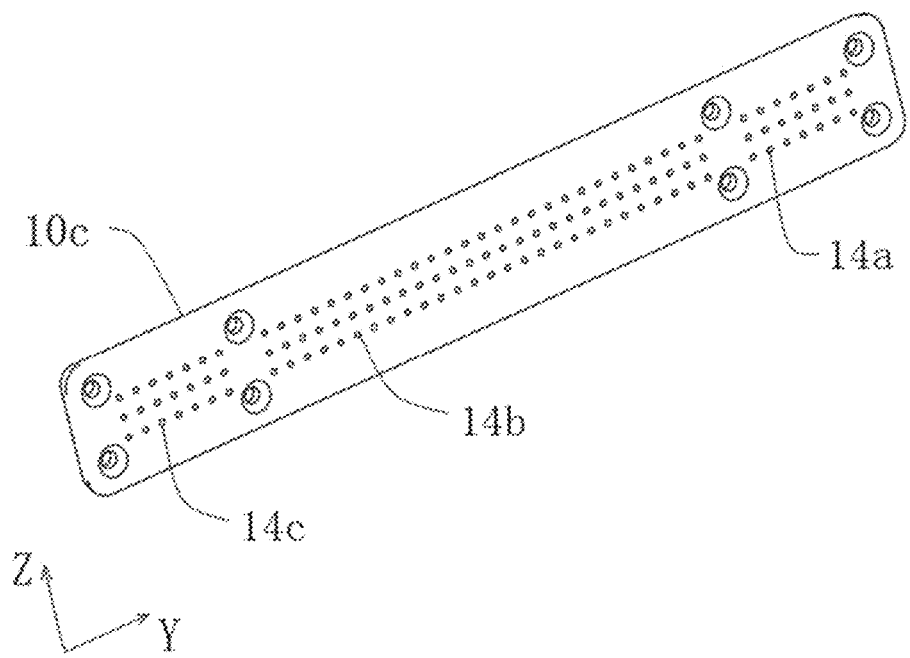
FIG. 6 illustrates a schematic structural diagram of a jet plate according to an embodiment of the present disclosure.

In some embodiments, a jet hole can be arranged at the jet plate 10c. The most downstream mixing chamber in the gas inlet direction can communicate with the gas inlet pipeline through the jet hole. A gas outlet direction of the jet hole can be the gas outlet direction of the gas inlet assembly 1. Moreover, a plurality of jet holes can be provided. The plurality of jet holes can be divided into a plurality of jet hole groups. A number of jet hole groups can be the same as a number of the sub-grooves and can be arranged in a one-to-one correspondence with the sub-grooves. For example, when one the mixing member 10b is provide, as shown in FIG. 6, for the three sub-grooves (111a, 111b, and 111c) of the mixing member 10b, the jet holes can be divided into three jet hole groups. A first jet hole group can include a plurality of jet holes 14a. The jet holes 14a can communicate with the sub-groove 111a of the mixing member 10b and the gas inlet pipeline 5. A second jet hole group can include a plurality of jet holes 14b. The jet holes 14b can communicate with the sub-groove 111b of the mixing member 10b and the gas inlet pipeline 5. A third jet hole group can include a plurality of jet holes 14c. The jet holes 14c can communicate with the sub-groove 111c of the mixing member 10b and the gas inlet pipeline 5.

In some embodiments, as shown in FIG. 5, a gas uniform hole is arranged at the bottom of the groove of the mixing member 10b. A plurality of gas uniform holes are provided. The plurality of gas uniform holes can be divided into a plurality of gas uniform hole groups. A number of the gas uniform hole groups can be the same as the number of the sub-grooves and can be arranged in a one-to-one correspondence. For example, corresponding to three sub-grooves (111a, 111b, and 111c), the gas uniform holes can be divided into three gas uniform hole groups. A first gas uniform hole group can include a plurality of gas uniform holes 12a arranged at the bottom of the sub-groove 111a of the mixing member 10b. The gas uniform holes 12a can communicate with the two sub-grooves 111a neighboring to the gas uniform holes 12a. A second gas uniform hole group can include a plurality of gas uniform holes 12b arranged at the bottom of the sub-groove 111b of the mixing member 10b. The gas uniform holes 12b can communicate with two sub-grooves 111b neighboring to the gas uniform holes 12b.

A third gas uniform hole group can include a plurality of gas uniform holes 12c arranged at the bottom of the sub-groove 111c of the mixing member 10b. The gas uniform holes 12c can communicate with two sub-grooves 111c neighboring to the gas uniform holes 12c.

In some embodiments, as shown in FIG. 5, to ensure the effect of gas flow and the gas flow speed to meet the process requirement, the plurality of gas uniform holes of each gas uniform hole group are arranged in an array in direction Y and in direction Z perpendicular to direction Y. Diameters of the plurality of gas uniform holes gradually increase from the center of the sub-groove towards the edges of the two sides along direction Y. For example, as shown in FIG. 5, the plurality of gas uniform holes 12b in the middle gas uniform hole group are arranged in 13 columns in direction Y and 2 rows in direction Z. In some embodiments, a number of rows in which the plurality of gas uniform holes in each gas uniform hole group are arranged in direction Z can be equal to or greater than 2.

Since the gas inlet hole is arranged at the center position of the corresponding sub-groove in direction Y, if the diameters of the plurality of gas uniform holes in the same gas uniform hole group corresponding to the sub-groove are the same, the gas flow speed output by the gas uniform holes close to the center can be greater than the gas flow speed output by the gas uniform holes from the edges of the two sides. Thus, by causing the diameters of the plurality of gas uniform holes in the same gas uniform hole group to gradually increase from the center of the corresponding sub-groove to the edges of the two sides along direction Y, resistances of the gas flow can gradually decrease from the center of the corresponding sub-groove to the edges of the two sides along direction Y. Thus, the gas flow speeds of the plurality of gas uniform holes of the same gas uniform group can be caused to be consistent as much as possible. Thus, most of the gas can be prevented from flowing out from the gas uniform holes at the center. The gas can be promoted to diffuse to the edges of the two sides. Thus, the gas can be sufficiently mixed, and the dead zone formed in the gas flow field can be reduced in the mixing chamber to ensure the gas flows out completely from the mixing chamber. Therefore, the process stability can be improved.

In some embodiments, to further ensure the effect of the gas flow, along the gas inlet direction (i.e., direction X) from upstream to downstream, a number of rows of the gas uniform holes in different gas uniform groups can gradually increase, and the number of gas uniform holes in a same row in different gas uniform hole groups can gradually increase. For example, if three mixing members are provided, from upstream to downstream in direction X, a number of rows of the gas uniform holes of each gas uniform hole group between the first mixing member and the second mixing member arranged in direction Z can be the smallest, for example, 2. A number of the gas uniform holes arranged in the same row in direction Z can be 3. A number of rows of the gas uniform holes of each gas uniform hole group between the second mixing member and the third mixing member arranged in direction Z can be increased by 1, i.e., 3. A number of gas uniform holes in a same row arranged in direction Z can be 4. It needs to be noted that the diameters of the gas uniform holes, the number of the rows arranged in direction Z, and the number of gas uniform holes of each row of each gas uniform hole group can be freely set according to actual needs.

In some embodiments, to improve the effect of gas mixing and uniforming and avoid the gas directly flowing from an upstream gas uniform hole to a neighboring gas uniform hole, a plurality of gas uniform holes in any two neighboring gas uniform hole groups can be staggered in direction X. That is, two gas uniform holes are not arranged axially. In addition, each jet hole can also be staggered with a neighboring gas uniform hole.

In some embodiments, to ensure the effect of gas mixing and uniforming, diameters of the gas uniform holes may not be too large. For example, the diameters of the gas uniform holes can be less than or equal to 4 mm.

In some embodiments, diameters of all the jet holes can be the same. For example, as shown in FIG. 6, diameters of the jet holes (14a, 14b, 14c) in the three jet hole groups are the same. Thus, the dead zone and vortex of the gas flow field formed in the gas inlet pipeline by the process gas output from the gas inlet assembly can be reduced. The process gas can be prevented from overflowing after saturation into the process chamber to react with the substrate. Thus, the process stability can be improved. In some embodiments, the diameter of the jet hole can be less than the diameter of the gas uniform hole to improve the effect of gas mixing as much as possible. For example, the diameter of the jet hole can be less than or equal to 4 mm.

In some embodiments, to further ensure the effect of gas flow, similar to the gas uniform holes, the plurality of jet holes in each jet hole group can be arranged in an array in direction Y and direction Z. For example, as shown in FIG. 6, in the three jet hole groups, the plurality of jet holes 14b in the middle jet hole group are arranged in 27 columns in direction Y and 3 rows in direction Z. In practical applications, a number of the rows in which the plurality of jet holes in each jet hole group are arranged in direction Z can be set according to specific requirements, usually greater than or equal to 2.

In some embodiments, to further ensure the effect of gas flow, the number of the rows in which the plurality of jet holes in each jet hole group are arranged in direction Z can be greater than the number of the rows in which the plurality of gas uniform holes in each gas uniform hole group are arranged in direction Z. In some embodiments, to further ensure the effect of gas flow, the number of the jet holes in a same row in each jet hole group can be greater than the number of the gas uniform holes in the same row in each gas uniform hole group.

Third Embodiment

Figure 7A:
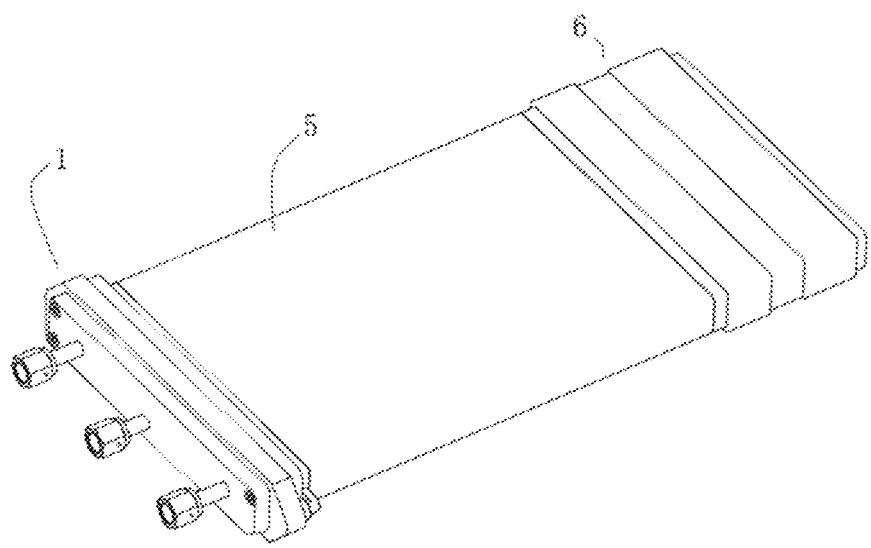
FIG. 7A illustrates a schematic perspective diagram of a gas inlet device according to an embodiment of the present disclosure.

As another technical solution, the third embodiment of the present disclosure provides a gas inlet device. As shown in FIG. 7A, the gas inlet device includes the gas inlet assembly 1 according to various embodiments of the present disclosure, a gas inlet pipeline 5, and a transition member 6. The gas inlet assembly 1 and the transition member 6 are respectively arranged at two ends of the gas inlet pipeline 5. The gas inlet pipeline 5 communicates with the process chamber (not shown in the figure) through the transition member 6. The gas inlet pipeline 5 can have a heat insulation function to cause the gas inlet assembly 1 (typically made of the metal material) to be away from the process chamber. In some embodiments, the length of the gas inlet pipeline 5 in direction X can be greater than or equal to 300 mm to ensure that the gas inlet assembly 1 is away from the process chamber. The transition member 6 is arranged between the gas inlet pipeline 5 and the process chamber to perform heat insulation on the gas inlet pipeline 5, while keeping the gas inlet pipeline 5 away from the process chamber. Thus, an ambient temperature where the gas inlet pipeline 5 is located can be within a range that the gas inlet pipeline 5 can withstand, which prevents the risk that the gas inlet pipeline 5 cannot withstand the high temperature and can be melted caused by the direction connection between the gas inlet pipeline 5 and the process chamber.

Figure 7B:
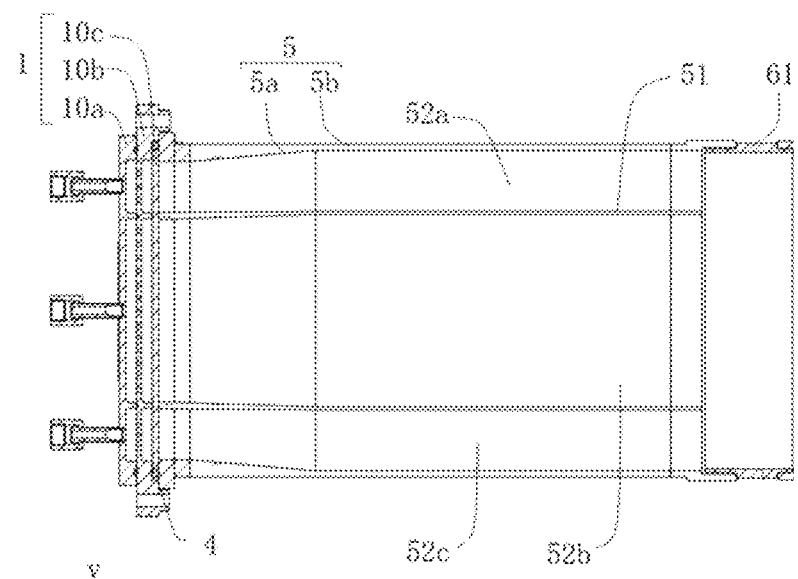
FIG. 7B illustrates a schematic cross-sectional diagram of a gas inlet device on plane X-Y according to an embodiment of the present disclosure.

In some embodiments, as shown in FIG. 7B, the gas inlet pipeline 5 includes a gradual expansion segment 5a and a straight segment 5b arranged sequentially along the gas inlet direction (i.e., direction X). A cross-sectional size (i.e., the size in direction Y) of the gradual expansion segment 5a gradually increases along the gas inlet direction. Thus, the process gas can be facilitated to gradually diffuse, and the process gas can be prevented from flowing out from the jet hole of the jet hole group to enter a gas flow channel with a relatively large flowing area to circulate to generate a vortex. Thus, the dead zone and vortex in the gas flow field can be reduced in the gas inlet pipeline 5. The process gas in the dead zone can be prevented from overflowing after being saturated to flow into the process chamber to react with the substrate. Thus, the process stability can be improved.

Figure 8:
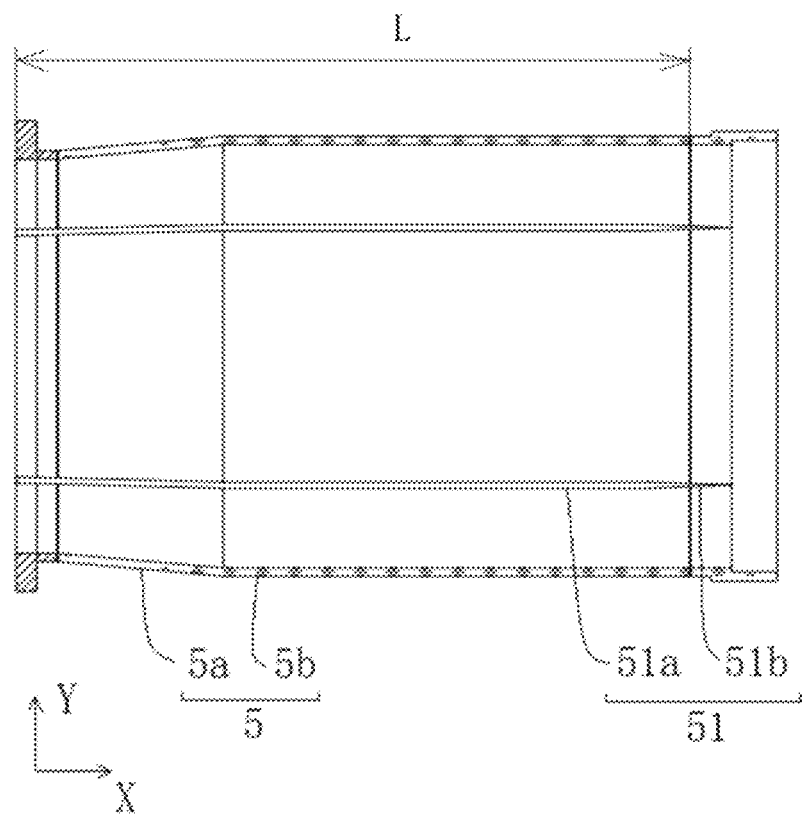
FIG. 8 illustrates a schematic cross-sectional diagram of a gas inlet device on plane X-Y according to an embodiment of the present disclosure.

In some embodiments, as shown in FIG. 8, at least one division plate 51 is arranged in the gas inlet pipeline 5 and configured to divide the gas inlet pipeline 5 into a plurality of gas flow channels in a direction (i.e., direction Y) perpendicular to the gas inlet direction, for example, three gas flow channels (52a, 52b, 52c) shown in FIG. 7B. As shown in FIG. 8, each division plate 51 includes a uniform thickness portion 51a and a gradually thinning portion 51b arranged sequentially along the gas inlet direction. The thickness of the gradually thinning portion 51b in direction Y decreases gradually from a gas inlet end to a gas outlet end. Thus, the process gas flowing out from the gas flow channel can be uniformly transitioned, and the process gas flowing out from the gas flow channel can be prevented from generating the vortex. In practical applications, the length of the gradually thinning portion 51b in direction X is not limited in embodiments of the present disclosure, as long as the gradually thinning portion 51b provides a function of uniform transition.

As shown in FIG. 7B, the three gas flow channels (52a, 52b, and 52c) are arranged with the three jet hole groups in a one-to-one correspondence. The two ends of each gas flow channel communicate with the plurality of jet holes in the corresponding jet hole group and the gas inlet of the process chamber, respectively. The three gas flow channels can be configured to transport the process gas output from the gas inlet assembly 1 to the process chamber and transport the gases flowing from the jet holes of different jet hole groups individually.

Figure 7C:
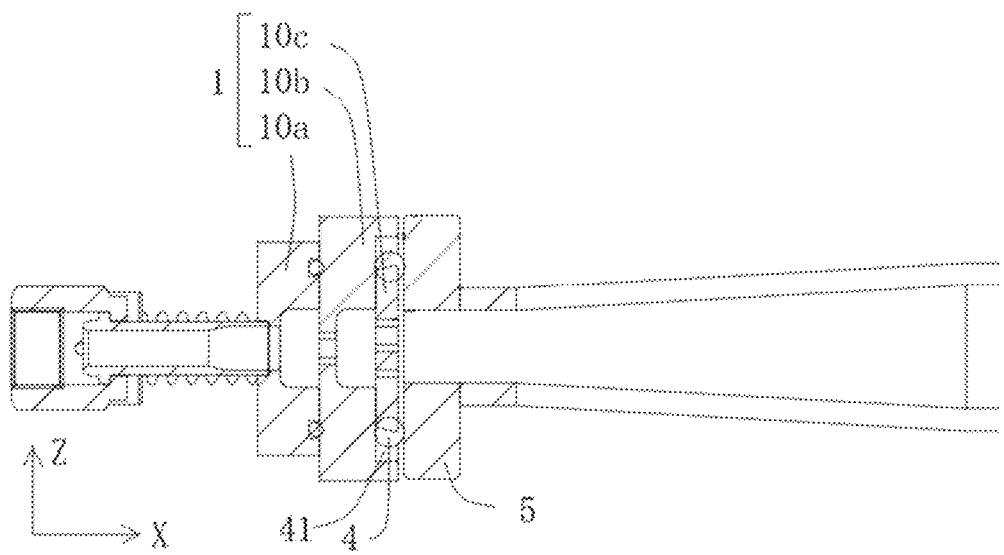
FIG. 7C illustrates a schematic partial cross-sectional diagram of a gas inlet device on plane X-Z according to an embodiment of the present disclosure.

In some embodiments, as shown in FIG. 7C, an isolation member 4 is arranged between the most downstream mixing member 10b in the gas inlet assembly 1 and the gas inlet pipeline 5 to isolate the most downstream mixing member 10b and the gas inlet pipeline 5 from each other. Thus, the gas inlet assembly 1 (typically made of the metal material) can be prevented from directly being mounted at and contacting with the gas inlet pipeline 5, which is made of a fragile material such as quartz. In some embodiments, an accommodation groove is arranged on the surface of the mixing member 10b facing the gas inlet pipeline 5. A jet plate 10c is arranged in the accommodation groove. An annular gap 41 is formed between an outer peripheral surface of the jet plate 10c and an inner peripheral surface of the accommodation groove. Moreover, the isolation member 4 can be a second sealing ring arranged in the annular gap 41 and can be configured to seal a mixing chamber between the jet plate 10c and the gas mixing member 10b. Moreover, the second sealing ring protrudes relative to a surface of the jet plate 10c facing the gas inlet pipeline 5 and is configured to isolate the jet plate 10c and the gas inlet pipeline 5 from each other. With the second sealing ring, the uniform flow chamber can be sealed, and the jet plate 10c and the gas inlet pipeline 5 can be isolated from each other.

In some embodiments, to ensure that the jet plate 5 and the gas inlet pipeline 5 are isolated from each other, the second sealing ring can be made of a material with a certain hardness. In some embodiments, a sealing ring with a Shore hardness of 60, such as fluororubber.

In some embodiments, as shown in FIG. 7A and FIG. 7B, a transition assembly 6 is connected to the gas inlet pipeline 5 and the process chamber. A preheating channel is arranged in transition assembly 6. The two ends of the preheating channel can be connected to gas outlet ends of the plurality of gas flow channels and the process chamber, respectively. In some embodiments, to facilitate the replacement of the transition assembly 6, transition assembly 6 includes a plurality of transition members sequentially inserted along the gas inlet direction. For example, FIG. 7B shows two transition members (61, 62). The most upstream transition member 61 in the gas inlet direction is inserted into the gas inlet pipeline 5, and the most downstream transition member 62 in the gas inlet direction communicates with the process chamber. By arranging a plurality of transition members (61, 62), the transition member 62 nearest to the process chamber can be replaced according to specific circumstances, thereby reducing the application cost.

In some embodiments, the gas inlet pipeline 5 can be made of quartz, and the transition member can be made of graphite. In this case, with the transition member, the gas inlet pipeline 5 can be away from the process chamber. The gas inlet pipeline 5 can be in the environment with the temperature being in a range that the gas inlet pipeline 5 can withstand. The gas inlet pipeline 5 can be prevented from directly contacting the process chamber to have a risk of melting. Moreover, the transition member made of graphite can have good thermal conductivity and cause the temperature of the process gas that passes by to gradually rise. Thus, before reaching the reaction area of the process chamber, the process gas can be pre-heated. Thus, the reaction efficiency of the process gas can be improved. In some embodiments, a protection layer can be formed at and cover the inner wall of the pre-heating channel of the transition assembly 6. The protection layer can be used to prevent impurities such as graphite particles from contaminating the process gas. The protection layer can be, for example, a silicon carbide layer.

Figure 9:
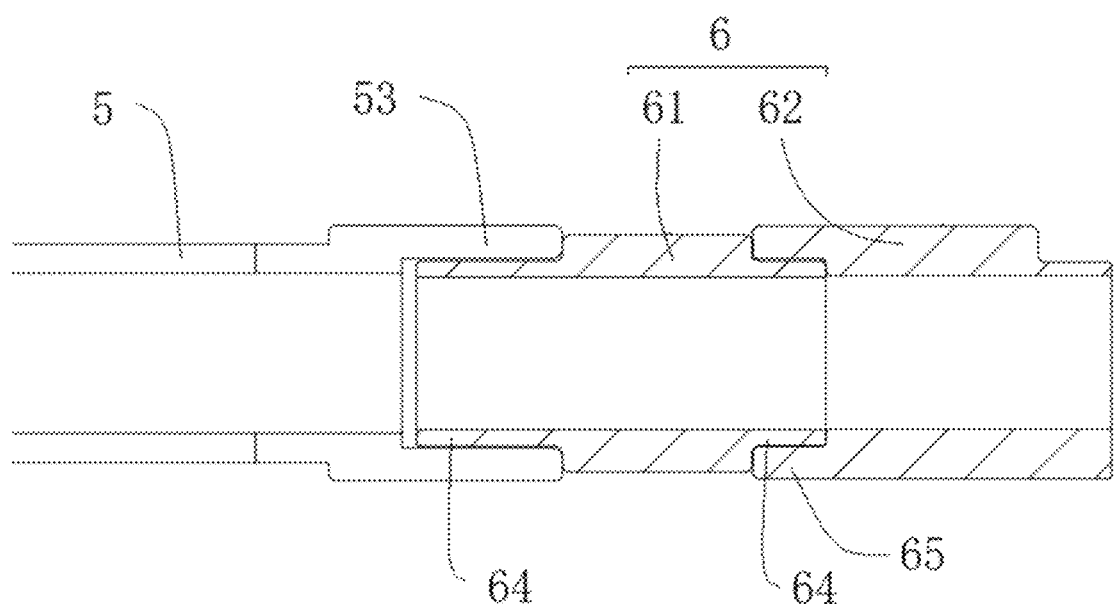
FIG. 9 illustrates a schematic cross-sectional diagram of a gas inlet device on plane X-Y according to an embodiment of the present disclosure.

In some embodiments, the gas inlet pipeline 5 and the transition members can be made of materials with different thermal expansion coefficients. For example, the gas inlet pipeline 5 can be made of quartz. The transition members can be made of graphite. To avoid damage to the components caused by different thermal expansion coefficients between the gas inlet pipeline 5 and the transition members, the gas inlet pipeline 5 and the transition members can be connected in an insertion manner. For example, as shown in FIG. 9, an end of the gas inlet pipeline 5 and an end of the transition member 61 that face each other can be provided with a first annular plugin member 53 and a second annular plugin member 64 mutually inserted. Thus, the gas inlet pipeline 5 and the transition member 61 do not have an enforcement installation such as threaded fixation therebetween. A first predetermined gap is arranged between an inner peripheral surface of the first annular plugin member 53 and an outer peripheral surface of the second annular plugin member 64, which reserves sufficient space for the thermal expansion deformation.

In addition, when a plurality of transition members are provided, as shown in FIG. 9, a second annular plugin member 64 and a third annular plugin member 65 mutually inserted are arranged between every two neighboring transition members (e.g., two transition members 61 and 62). A second predetermined gap is formed between an inner peripheral surface of the third annular plugin member 65 and an outer peripheral surface of the second annular plugin member 64.

Figure 10:
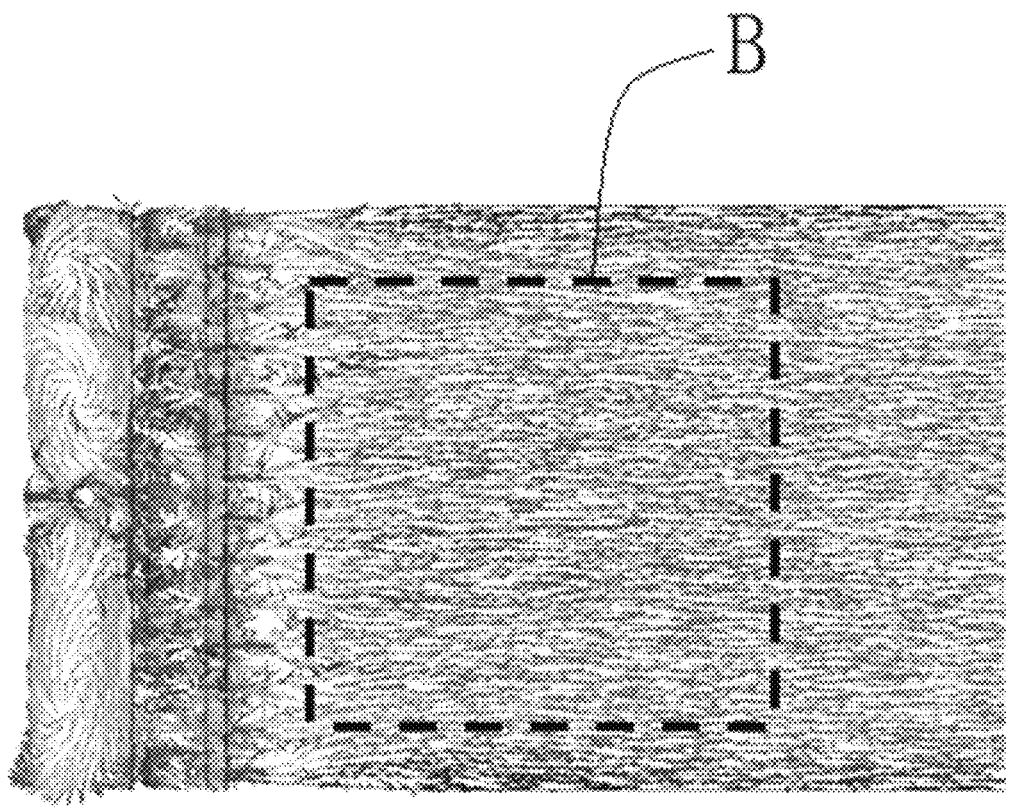
FIG. 10 illustrates a schematic diagram showing a gas flow field of a gas inlet device on plane X-Y according to an embodiment of the present disclosure.
Figure 11:
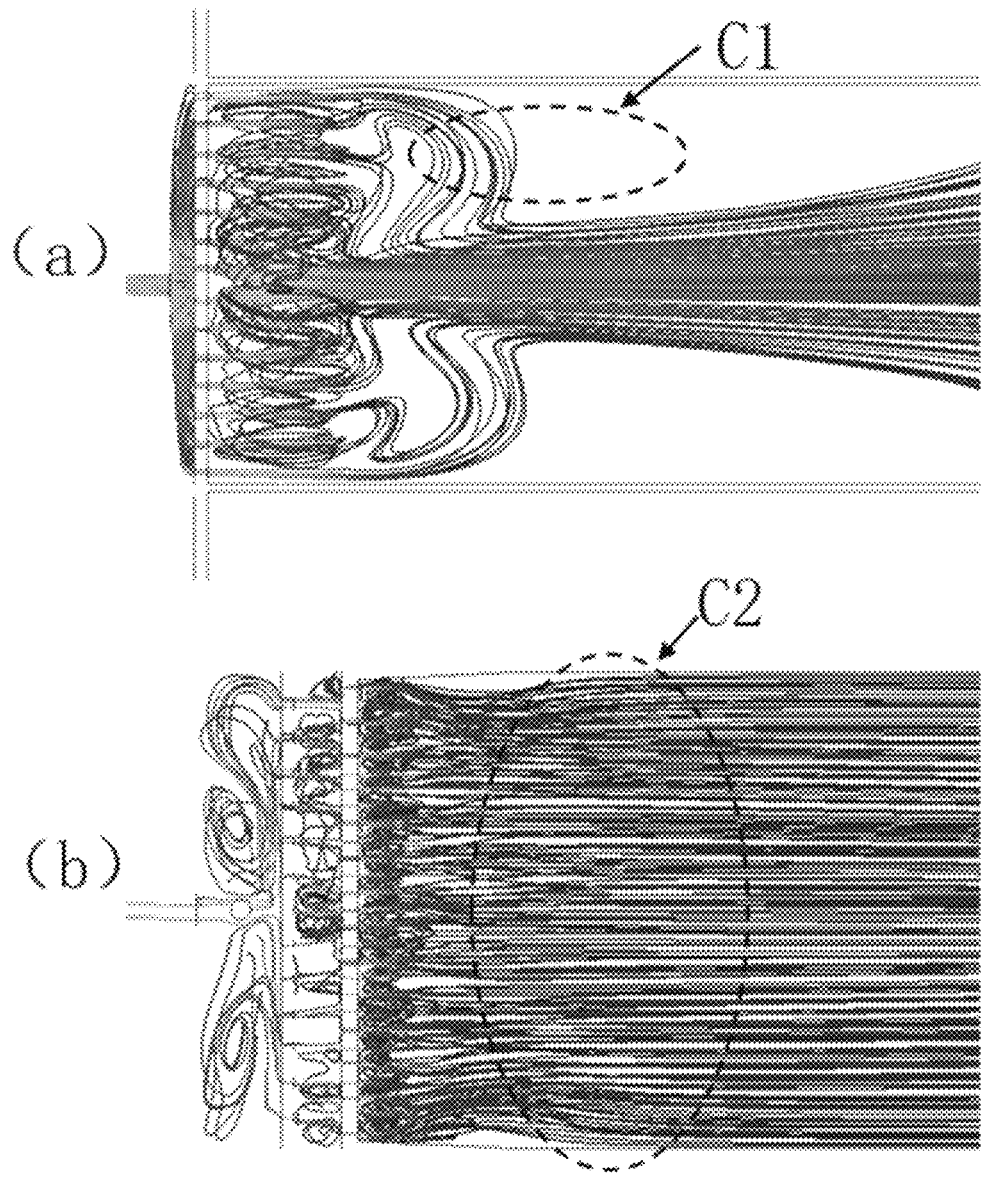
FIG. 11 illustrates a schematic comparison diagram between a flowing line of the gas flow field and the gas inlet device according to an embodiment of the present disclosure.

In the gas inlet device of embodiments of the present disclosure, FIG. 10 shows a gas flow field in the gas inlet pipeline 5. As shown in FIG. 10, the process gas flowing out from the gas inlet assembly 1 does not have the vortex and dead zone in area B of the gas flow field in the gas inlet pipeline 5. FIG. 11 illustrates a schematic comparison diagram between a flowing line of the gas flow field of the existing technology and a flowing line of the gas flow field of the gas inlet device according to an embodiment of the present disclosure. In FIG. 11(*a*), the vortex and dead zone exist obviously in area C1 of the gas flow field of the process gas flowing out from the gas inlet device in the division body. In contrast, in FIG. 11(*b*), almost no vortex and dead zone exist in area C2 of the gas flow field of the process gas flowing out from the gas inlet device of embodiments of the present disclosure in the gas inlet pipeline 5. Meanwhile, the plurality of gas components of the process gas can be sufficiently mixed, and the process gas can sufficiently diffuse. Thus, the components of the process gas can be uniformly distributed.

In summary, with the gas inlet device of embodiments of the present disclosure, by adopting the gas inlet assembly of embodiments of the present disclosure, the distribution uniformity of the components of the process gas can be improved, and the difference between the gas flow speeds between different areas of the gas inlet pipeline can be reduced. Thus, the process stability can be improved.

Fourth Embodiment

The fourth embodiment of the present disclosure provides a semiconductor processing apparatus, including a process chamber 7 and a gas inlet device of the process chamber. The gas inlet device can adopt the gas inlet device of the third embodiment of the present disclosure.

Figure 12:
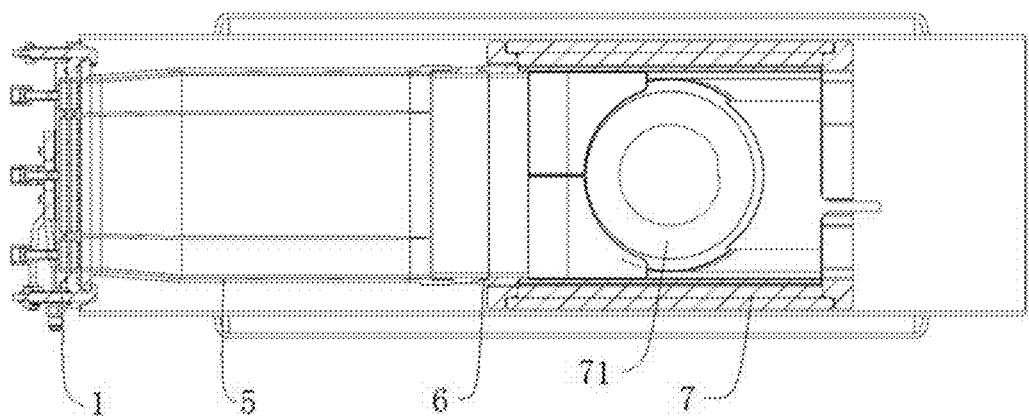
FIG. 12 illustrates a cross-sectional diagram of a semiconductor processing apparatus according to an embodiment of the present disclosure.

In some embodiments, as shown in FIG. 12, the gas inlet device includes a gas inlet assembly 1, a gas inlet pipeline 5, and a transition assembly 6, which are connected sequentially along the gas inlet direction. Transition assembly 6 is connected to the process chamber 7, and the pre-heating channel of the transition assembly 6 internally communicates with the process chamber 7. Thus, the plurality of independent channels of process gas can sequentially pass through gas inlet assembly 1, the gas inlet pipeline 5, and the transition assembly 6 to flow into different areas of a base 71 in the process chamber 7.

With the semiconductor processing apparatus of embodiments of the present disclosure, by adopting the gas inlet device of embodiments of the present disclosure, the process gas can be sufficiently mixed and homogenized, and the differences in the gas flow speeds between different areas of the process chamber can be further reduced. Thus, the process stability can be improved.

It is understood that the above embodiments are merely exemplary and illustrative embodiments adopted to illustrate the principles of the present disclosure. However, the present disclosure is not limited to this. Those of ordinary skill in the art can make various modifications and improvements without departing from the spirit and essence of the present disclosure. These modifications and improvements are within the scope of the present disclosure.

What is claimed is:

1. A gas inlet assembly of a process chamber in a semiconductor process apparatus, configured to transport a process gas to a gas inlet pipeline communicating with the process chamber, comprising:
    a plurality of mixing chambers arranged sequentially along a gas inlet direction, any two neighboring mixing chambers communicating with each other;
    a gas inlet connector communicating with a most upstream mixing chamber in the gas inlet direction;
    wherein:
        a most downstream mixing chamber in the gas inlet direction communicates with the gas inlet pipeline;
        a gas outlet direction of the gas inlet assembly is same as the gas inlet direction;
        the gas inlet pipeline is downstream of the plurality of mixing chambers in the gas inlet direction;
        the gas inlet pipeline includes a gradually expanding pipe segment and a straight pipe segment arranged sequentially along the gas inlet direction;
        a cross-sectional size of the gradually expanding pipe segment gradually increases along the gas inlet direction;
        a division plate is arranged in the gradually expanding pipe segment and the straight pipe segment of the gas inlet pipeline and configured to divide the gas inlet pipeline into a plurality of gas flow channels along a direction perpendicular to the gas inlet direction;
        the division plate includes a uniform thickness portion and a gradually thinning portion arranged sequentially along the gas inlet direction; and
        a thickness of the gradually thinning portion gradually decreases along the gas inlet direction.

2. The gas inlet assembly according to claim 1, further comprising:
    a gas inlet member including a groove with an opening facing the gas inlet direction, the gas inlet connector being arranged at the gas inlet member;
    one or more mixing members including a groove with an opening facing the gas inlet direction; and
    a jet plate arranged at an opening of a groove of a most downstream mixing member in the gas inlet direction and cooperating with the groove of the most downstream mixing member in the gas inlet direction to form a mixing chamber of the plurality of mixing chambers;
    wherein:
    the gas inlet member, the one or more mixing members, and the jet plate are connected in sequence in the gas inlet direction; and
    the groove of the gas inlet member cooperates with a most upstream mixing member in the gas inlet direction to form a mixing chamber of the plurality of mixing chambers.

3. The gas inlet assembly according to claim 2, wherein:
    a gas inlet hole is arranged at a bottom of the groove of the gas inlet member;
    the gas inlet connector communicates with the gas inlet hole;
    a gas uniform hole is arranged at a bottom of the groove of the one or more mixing members;
    any two neighboring mixing chambers communicate with each other through the gas uniform hole;

a jet hole is arranged at the jet plate; and the most downstream mixing chamber in the gas inlet direction communicates with the gas inlet pipeline through the jet hole.

4. The gas inlet assembly according to claim 3, wherein:

at least one isolation member is arranged in the groove and configured to divide the groove into a plurality of sub-grooves in a direction perpendicular to the gas inlet direction;

a plurality of gas inlet holes are provided and divided into a plurality of gas inlet hole groups;

a number of the plurality of gas inlet hole groups is same as a number of the plurality of sub-grooves, and the plurality of gas inlet hole groups are in a one-to-one correspondence with the plurality of sub-grooves;

a plurality of gas uniform holes are provided and divided into a plurality of gas uniform hole groups;

a number of the plurality of gas uniform hole groups is same as the number of the plurality of sub-grooves, and the plurality of gas uniform hole groups are in a one-to-one correspondence with the plurality of sub-grooves;

a plurality of jet holes are provided and divided into a plurality of jet hole groups;

a number of the plurality of jet hole groups is same as the number of the plurality of sub-grooves, and the plurality of jet hole groups are in a one-to-one correspondence with the plurality of sub-grooves;

a gas outlet direction of the jet hole is the gas outlet direction.

5. The gas inlet assembly according to claim 4, wherein:

each gas uniform hole group of the plurality of gas uniform hole groups includes a plurality of gas uniform holes;

the plurality of gas uniform holes in the same gas uniform hole group are arranged in an array; and diameters of the plurality of gas uniform holes gradually increase from a center of the corresponding sub-groove to edges on two sides.

6. The gas inlet assembly according to claim 5, wherein from upstream to downstream along the gas inlet direction, a number of rows of gas uniform holes in different gas uniform hole groups gradually increases, and a number of gas uniform holes in a same row in different gas uniform hole groups gradually increases.

7. The gas inlet assembly according to claim 6, wherein in the gas inlet direction, gas uniform holes in any two neighboring gas uniform hole groups are staggered.

8. The gas inlet assembly according to claim 4, wherein:

each jet hole group of the plurality of jet hole groups includes a plurality of jet holes;

the plurality of jet holes are arranged in an array;

diameters of the plurality of jet holes are same and smaller than diameters of the gas uniform holes;

a number of rows of the plurality of jet holes of the jet hole group is greater than a number of rows of the plurality of gas uniform holes of the corresponding gas uniform hole group; and a number of jet holes of any row of the jet hole group is greater than the number of the gas uniform holes in a same row of the corresponding gas uniform hole group.

9. The gas inlet assembly according to claim 1, wherein:

the gas inlet pipeline is made of quartz.

10. The gas inlet assembly according to claim 2, wherein:

the one or more mixing members include a plurality of mixing members, and in any two neighboring mixing members of the plurality of mixing members, a groove of an upstream mixing member cooperates with a downstream mixing member to form a mixing chamber of the plurality of mixing chambers.

* * * * *